(12) United States Patent
Choi

(10) Patent No.: US 11,232,737 B2
(45) Date of Patent: Jan. 25, 2022

(54) TRACE DESIGN TO REDUCE BEZEL AREA

(71) Applicant: Google LLC, Mountain View, CA (US)

(72) Inventor: Sangmoo Choi, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/342,367

(22) Filed: Jun. 8, 2021

(65) Prior Publication Data

US 2021/0304654 A1     Sep. 30, 2021

Related U.S. Application Data

(60) Provisional application No. 63/194,726, filed on May 28, 2021.

(51) Int. Cl.
*G09G 3/20* (2006.01)

(52) U.S. Cl.
CPC ....... *G09G 3/20* (2013.01); *G09G 2300/0413* (2013.01)

(58) Field of Classification Search
None
See application file for complete search history.

(56) References Cited

U.S. PATENT DOCUMENTS

| 2016/0027380 A1 | 1/2016 | Kim et al. |
| 2017/0287390 A1 | 10/2017 | Lee et al. |
| 2019/0043892 A1 | 2/2019 | Lee et al. |
| 2020/0074912 A1 | 3/2020 | Kitsomboonloha et al. |

*Primary Examiner* — Aneeta Yodichkas
(74) *Attorney, Agent, or Firm* — Colby Nipper PLLC

(57) ABSTRACT

Techniques and apparatuses are described that implement a trace design to reduce bezel area (106). An apparatus includes a pixel array (302) comprising pixel rows (112). The apparatus also includes a row line-driver (110-1) configured to provide electrical signals to at least two of the pixel rows (112-1, 112-2). The apparatus further comprises a plurality of electrical traces (202) that connect the row line-driver (110-1) to the pixel rows. At least one of the electrical traces (202) comprises a branch (210) such that a signal carried by the at least one of the electrical traces (202) enters the at least two of the pixel rows (112-1, 112-2). The branch is disposed closer to the pixel rows (112-1, 112-2) than the row line-driver (110-1). In this way, a number of the electrical traces (202) crossing a bezel area (106) is reduced compared to branching near the row line-driver (110-1).

10 Claims, 3 Drawing Sheets

TRACE DESIGN TO REDUCE BEZEL AREA

CROSS REFERENCE TO RELATED APPLICATION

This application claims priority to U.S. Provisional application Ser. No. 63/194,726, filed May 28, 2021, the disclosure of which is incorporated herein by reference.

BACKGROUND

A pixel array (e.g., display, display panel, or OLED display) often has support circuitry outside of the pixel array that enables the pixel array to function. For example, a two-dimensional pixel array often has row line-drivers that drive respective rows of pixels. The row line-drivers are connected to the rows of pixels via electrical traces that are often disposed in a bezel area of the device (e.g., an area between the pixel array and extents of the device).

Some row-line drivers are configured to drive a plurality of pixel rows. This is often accomplished through branching one or more of the electrical traces (e.g., adjacent rows can often utilize the same signal). However, the branching is often at or near the row-line drivers. As such, the number of electrical traces spanning the bezel area is the same as if the electrical traces were not branched. This leads to a larger bezel area. This is especially true for corner regions of the pixel array where, due to physical constraints of devices with rounded corners, the row-line drivers for the corner rows of pixels are often placed non-adjacent (e.g., offset) to those pixel rows. This leads to multiple sets of electrical traces spanning the corner region of the bezel area. Increased bezel area contributes to poor form factor and aesthetics.

SUMMARY

Techniques and apparatuses are described that implement a trace design to reduce bezel area. An apparatus includes a pixel array comprising rows of pixels. The apparatus also includes at least one row line-driver configured to provide electrical signals to at least two of the rows of pixels. The apparatus further includes a plurality of electrical traces that connect the row line-driver to the at least two rows of pixels. At least one of the electrical traces has a branch in it, such that a number of electrical traces leaving the row line-driver is less than a number of electrical traces that enter the at least two rows of pixels. The distance between the branch and the row line-driver is greater than the distance between the branch and pixels in the at least two rows of pixels. In this way, a number of electrical traces that traverse a bezel region of the apparatus is reduced. This reduction allows physical extents of the apparatus to be reduced, thereby increasing form factor and aesthetics.

BRIEF DESCRIPTION OF THE DRAWINGS

Apparatuses for and techniques implementing trace design to reduce bezel area are described with reference to the following drawings. The same numbers are used throughout the drawings to reference like features and components.

DETAILED DESCRIPTION

Overview

Many devices contain displays and bezel areas surrounding the displays. The displays often have support circuitry (e.g., row line-drivers) connected to pixels of the displays. The support circuitry is connected to the pixels via electrical traces that often span the bezel areas. An amount of space consumed by the electrical traces (e.g., by a number of the electrical traces) often dictates a size of the bezel areas, especially in corner regions. While techniques have been developed to minimize an amount of the support circuitry (e.g., by using row-line drivers configured to drive multiple rows of pixels), the space consumed by the electrical traces has not been similarly reduced.

To address this issue, techniques and apparatuses are described that implement a trace design to reduce bezel area. The apparatuses include a pixel array comprising a plurality of rows of pixels and a row line-driver configured to provide electrical signals to the rows of pixels. The row line-driver is connected to the rows of pixels via a plurality of electrical traces that traverse a bezel region. At least one of the electrical traces comprises an electrical branch, such that a number of electrical traces leaving the row line-driver is less than a combined number of electrical traces that enter the rows of pixels. The electrical branch is disposed closer to the rows of pixels than the row line-driver. In this way, a number of electrical traces that traverse the bezel region is reduced. This reduction allows physical extents of the apparatuses to be reduced, thereby increasing form factor and aesthetics.

Example Environment

Figure 1:
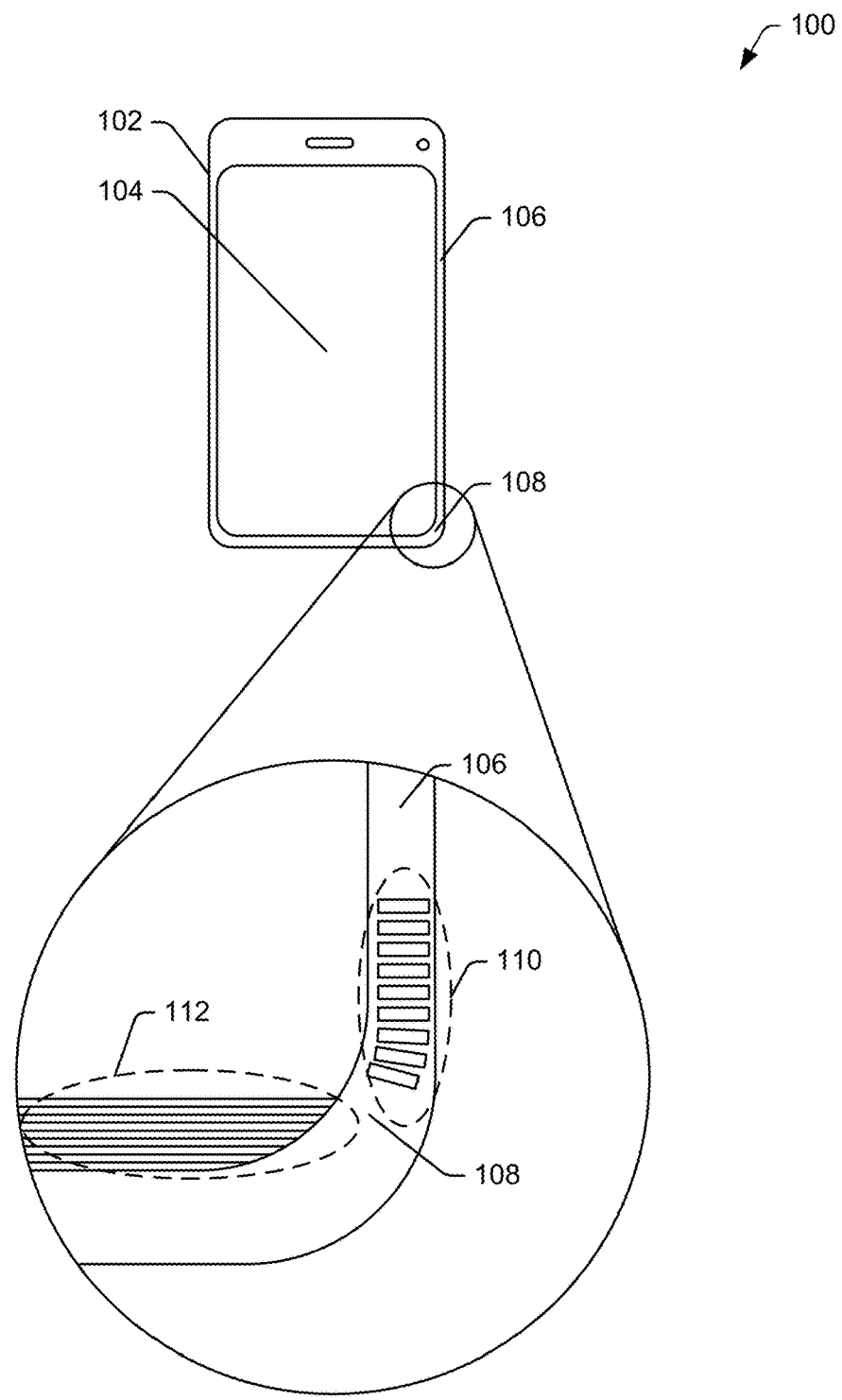
FIG. 1 is an example illustration of a device in which trace design to reduce bezel area can be implemented.

FIG. 1 is an example illustration 100 of a device in which trace design to reduce bezel area can be implemented. The examples illustration 100 includes a device 102 with a display active area 104. The device 102 may be any computing device (e.g., mobile phone, watch, laptop, monitor, tablet, or smart device), and the display active area 104 may be any display containing a two-dimensional pixel array (e.g., plasma, LCD, LED, or OLED). The device 102 has a bezel area 106 between the display active area 104 and physical extents of the device 102. The bezel area 106 has a corner region 108 that is shown in more detail below the illustration of the device 102.

Disposed in the bezel area 106 is a plurality of row line-drivers 110 for providing electrical signals to respective pixel rows 112. The row line-drivers 110 are connected to the pixel rows 112 via electrical traces crossing the bezel area 106 (e.g., the corner region 108). Other electrical traces also cross the bezel area 106 (e.g., not from the row line-drivers 110). The electrical traces and connections to the pixel rows 112 are discussed further in regard to FIGS. 2 and 3.

Example Schematic

Figure 2:
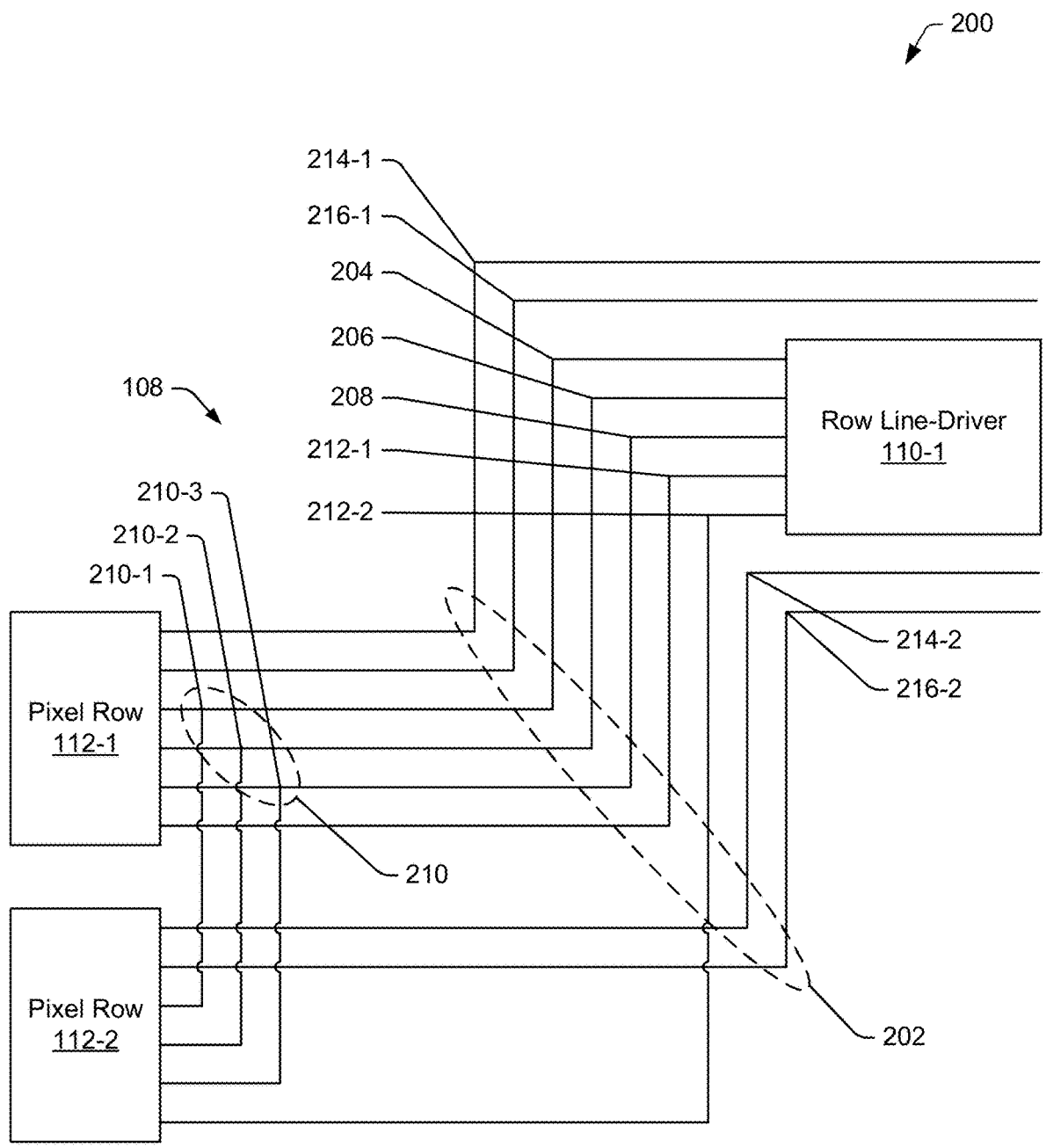
FIG. 2 is an example illustration of a schematic of a trace design to reduce bezel area.

FIG. 2 is an example illustration 200 of a schematic of a trace design to reduce bezel area. The example illustration 200 includes a row line-driver 110-1 and pixel rows 112-1 and 112-2. The example illustration 200 also includes a plurality of electrical traces 202 connected to the pixel rows 112-1 and 112-2. Some of the electrical traces 202 are connected to the row line-driver 110-1.

The example illustration 200 shows the pixel rows 112-1 and 112-2 as being vertically offset from the row line-driver 110-1. This is indicative of how the respective components are disposed in the corner region 108. For example, because the row line-drivers 110 for the pixel rows 112 that terminate at the corner region 108 often cannot be disposed within the corner region 108, such row line-drivers 110 are often disposed vertically offset (e.g., higher along a side portion of the bezel area 106). The vertical offset generally requires that the electrical traces 202 for those pixel rows 112 be longer than for other pixel rows 112. The longer electrical traces 202 lead to multiple sets of electrical traces 202 (e.g., electrical traces 202 for a single pixel row 112 or pair of pixel rows 112) being run parallel through the corner region 108. As such, the space reduction realized by the trace design in the corner region 108 is amplified. However, the trace design may be implemented in other regions of the bezel area 106 and provide similar space-saving results.

The example illustration 200 has five of the electrical traces 202 exiting the row line-driver 110-1. The electrical traces 202 comprise an nGI trace 204, EM trace 206, and an nGW trace 208 that are all branched (via branches 210). For example, the nGI trace 204 is branched at 210-1, the EM trace 206 is branched at 210-2, and the nGW trace 208 is branched at 210-3. The branches 210 allow the nGI trace 204, the EM trace 206, and the nGW trace 208 to supply respective signals to both pixel rows 112-1 and 112-2. The two other electrical traces 202 that exit the row line-driver 110-1 comprise pGW traces 212-1 and 212-2 that are not branched and are connected to pixel rows 112-1 and 112-2, respectively.

The electrical traces 202 also comprise Vinit1 traces 214 connected to the pixel rows 112-1 and 112-2 (e.g., Vinit1 trace 214-1 for pixel row 112-1 and Vinit1 trace 214-2 for pixel row 112-2). The electrical traces 202 further comprise Vinit2 traces 216 connected to the pixel rows 112-1 and 112-2 (e.g., Vinit2 trace 216-1 for pixel row 112-1 and Vinit2 trace 216-2 for pixel row 112-2).

The Vinit1 traces 214 and the Vinit2 traces 216 are voltage sources for the respective pixel rows 112. For example, the Vinit1 traces 214 may be used to supply a voltage source to initialize capacitors of the pixels of the pixel rows 112. The Vinit2 traces 216 may be used to supply another voltage source to initialize anode electrodes of the pixels. The Vinit1 traces 214 and Vinit2 traces 216 may be connected to respective bus lines adjacent to the row line-driver 110 (not shown).

The pGW traces 212 may be used to write new image voltage data (Vdata) to capacitors of the pixels. The nGI trace 204 may be used to initialize the capacitors of the pixels to a lower voltage than the Vdata prior to the Vdata being written to the pixel circuit. The EM trace 206 may be used to disconnect an emission power source (ELVDD) and the actual LEDs of the pixels from their respective circuits for initialization and data writing. For example, a high signal on the EM trace 206 may correspond to a light emission off-state, and a low signal on the EM trace 206 may correspond to a light emission on-state. The nGW trace 208 may be used to connect diodes of the pixels to compensate for threshold voltage variations of transistors within the pixels.

Although described in terms of a single row line-driver 110, the trace design may be repeated for other row line-drivers 110. Furthermore, the number of electrical traces 202, the specifics of each of the electrical traces 202 (e.g., what signal they carry), and which of the electrical traces 202 are branched may change without departing from the scope of this disclosure. As long as one of the electrical traces 202 entering two or more pixel rows 112 is branched, the trace design described herein may be space-efficient.

As shown, the branches 210 are disposed closer to the pixel rows 112 than the row line-driver 110-1. This enables a number of the electrical traces 202 crossing the corner region 108 to be reduced. For example, in the example illustration 200, there are nine electrical traces 202 crossing the corner region 108. The location of the branches 210 will be discussed further in regard to FIG. 3.

Example Implementation

Figure 3:
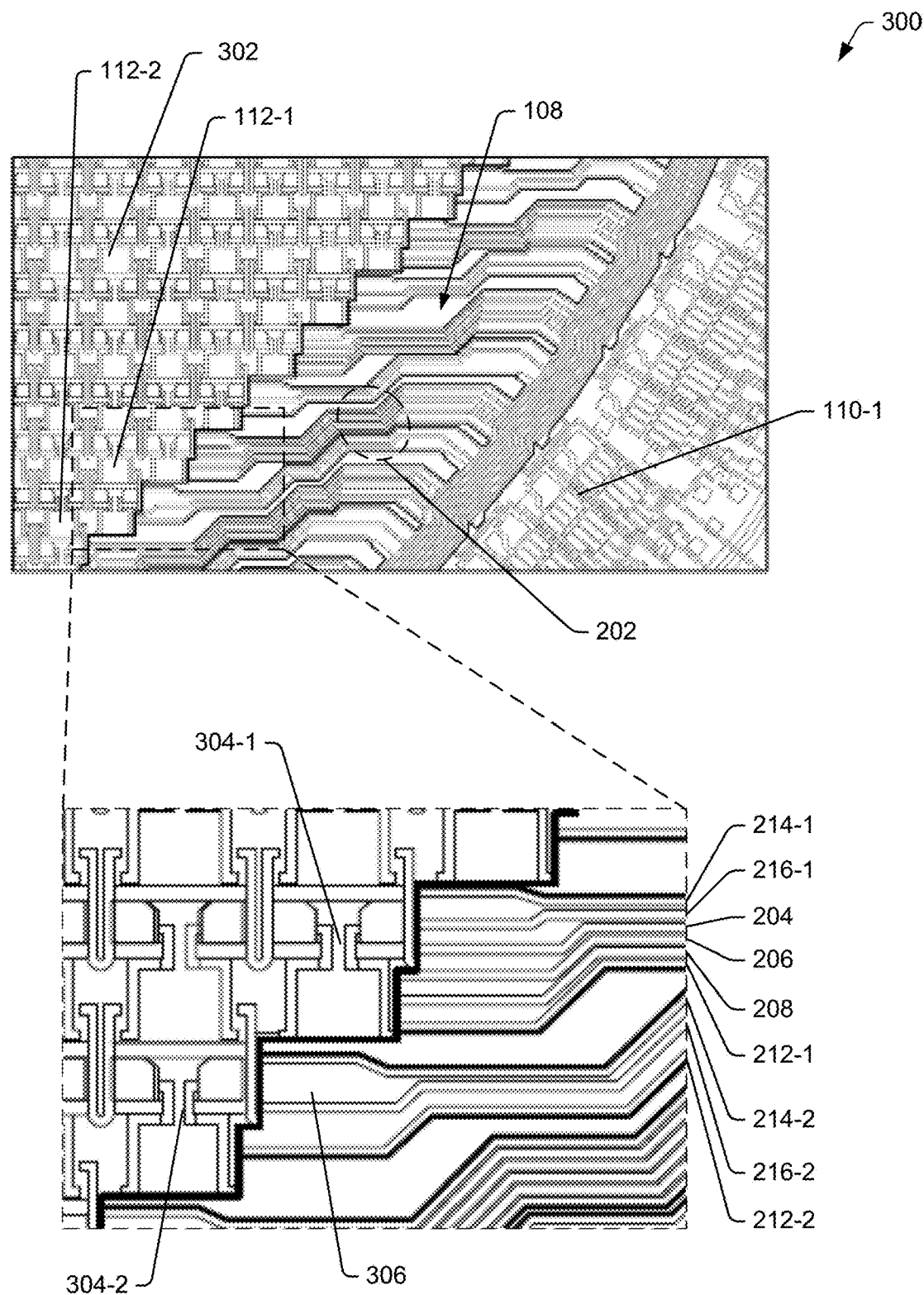
FIG. 3 is an example illustration of a trace design to reduce bezel area.

FIG. 3 is an example illustration 300 of a trace design to reduce bezel area. The example illustration 300 generally corresponds to the example illustration 200. As such, the portion of the device 102 shown corresponds to the corner region 108.

The example illustration 300 shows a pixel array 302 with the pixel rows 112-1 and 112-2 and the row line-driver 110-1. The row line-driver 110-1 may be disposed up to 1500 μm or more from the pixel rows 112-1 and 112-2, depending on where the pixel rows 112-1 and 112-2 are in relation to the corner region 108. Although the branches 210 are not shown, the branches 210 may be within 200 μm or less, and preferably less than approximately 100 μm, and most preferably 0-10 μm of the pixel rows 112-1 and 112-2. As such, the distance between the branches 210 and the pixel rows 112-1 and 112-2 may be constant regardless of where the row line-driver 110-1 is relative to the pixel rows 112-1 and 112-2. In other words, as a total distance between the pixel rows 112-1 and 112-2 and the row line-driver 110-1 is increased, a distance between the pixel rows 112-1 and 112-2 and the branches 210 may be constant.

The pixel rows 112-1 and 112-2 often comprise dummy pixels 304 at their extents (e.g., dummy pixel 304-1 for pixel row 112-1 and dummy pixel 304-2 for pixel row 112-2). The dummy pixels 304 are to protect the active pixels in the pixel array 302 from electrostatic discharge (ESD) and to improve pattern etching uniformity in the active pixels. The dummy pixels 304 often contain a plurality of metal layers in the thin-film transistor (TFT) stack up that do not contribute to the above technical effects.

In some implementations, the branches 210 may be disposed within the dummy pixel 304-1. For example, the nGI trace 204, EM trace 206, and nGW trace 208 may enter the dummy pixel 304-1, branch within the dummy pixel 304-1 (e.g., within a first couple of the metal layers), and the electrical traces leaving the branches may enter pixel rows 112-2 and 112-3. The branched nGI trace 204, EM trace 206, and nGW trace 208 may be run through an area 306 adjacent to the dummy pixel 304-2 to enter the pixel row 112-2 or be run completely through the respective dummy pixels. Either way, the same nine electrical traces 202 cross at least a majority of the corner region 108 prior to one or more of them being branched to enter the pixel rows 112.

By using the trace design described above (e.g., branching one or more of the electrical traces 202 at or near the pixel rows 112), a number of the electrical traces 202 crossing the corner region 108 is reduced compared to branching near the row line-driver 110-1. By doing so, the bezel area 106 may be reduced, especially in the corner region 108. This leads to improved form factor and user satisfaction.

EXAMPLES

Example 1: An apparatus comprising: a pixel array comprising rows of pixels; a row line-driver configured to provide electrical signals to at least two of the rows of pixels; and a plurality of electrical traces that connect the row line-driver to the at least two rows of pixels, at least one of the electrical traces comprising a branch such that a signal carried by the at least one of the electrical traces enters the at least two of the pixel rows, the branch disposed closer to the at least two rows of pixels than the row line-driver.

Example 2: The apparatus of example 1, wherein the branch is disposed adjacent to the at least two rows of pixels.

Example 3: The apparatus of example 2, wherein: the pixel array comprises dummy pixels at extents of the pixel array; and the branch is disposed proximate to one of the dummy pixels.

Example 4: The apparatus of example 3, wherein the branch is disposed on top of the one of the dummy pixels.

Example 5: The apparatus of example 4, wherein the branch is disposed within a first or second layer from a top of a thin-film transistor stack of the dummy pixel.

Example 6: The apparatus of example 1, wherein the electrical traces cross a bezel area of the apparatus.

Example 7: The apparatus of example 6, wherein the electrical traces cross a corner region of the bezel area of the apparatus.

Example 8: The apparatus of example 7, wherein the corner region of the bezel area of the apparatus is rounded.

Example 9: The apparatus of example 1, wherein the at least one of the electrical traces is configured to: provide a voltage source to the at least two rows of pixels; provide a signal to connect or disconnect an emission power source within the pixels of the at least two rows of pixels; or provide a signal to connect a diode within the pixels of the at least two rows of pixels.

Example 10: The apparatus of example 1, wherein the at least one of the electrical traces comprises a plurality of electrical traces with respective branches.

CONCLUSION

Although techniques using, and apparatuses including, a trace design to reduce bezel area have been described in language specific to features and/or methods, it is to be understood that the subject of the appended claims is not necessarily limited to the specific features or methods described. Rather, the specific features and methods are disclosed as example implementations of a trace design to reduce bezel area.

The invention claimed is:

1. An apparatus comprising:
 a pixel array comprising rows of pixels;
 a row line-driver configured to provide electrical signals to at least two of the rows of pixels; and
 a plurality of electrical traces that connect the row line-driver to the at least two rows of pixels, at least one of the electrical traces comprising a branch such that a signal carried by the at least one of the electrical traces enters the at least two of the pixel rows, a distance between the branch and the drivers being greater than a distance between the branch and at least one pixel of each of the at least two rows of pixels.

2. The apparatus of claim 1, wherein the branch is disposed within 200 μm of the at least two rows of pixels.

3. The apparatus of claim 2, wherein:
 the pixel array comprises dummy pixels at extents of the pixel array; and
 the branch is disposed proximate to one of the dummy pixels.

4. The apparatus of claim 3, wherein the branch is disposed on top of the one of the dummy pixels.

5. The apparatus of claim 4, wherein the branch is disposed within a first or second layer from a top of a thin film transistor stack of the dummy pixel.

6. The apparatus of claim 1, wherein the electrical traces cross a bezel area of the apparatus.

7. The apparatus of claim 6, wherein the electrical traces cross a corner region of the bezel area of the apparatus.

8. The apparatus of claim 7, wherein the corner region of the bezel area of the apparatus is rounded.

9. The apparatus of claim 1, wherein the at least one of the electrical traces is configured to:
 provide a voltage source to the at least two rows of pixels;
 provide a signal to connect or disconnect an emission power source within the pixels of the at least two rows of pixels; or
 provide a signal to connect a diode within the pixels of the at least two rows of pixels.

10. The apparatus of claim 1, wherein the at least one of the electrical traces comprises a plurality of electrical traces with respective branches.

* * * * *